United States Patent [19]
Kreuzgruber et al.

[11] Patent Number: 5,586,147
[45] Date of Patent: Dec. 17, 1996

[54] DEMODULATION METHOD USING QUADRATURE MODULATION

[75] Inventors: Peter Kreuzgruber; Werner Schladofsky, both of Vienna; Peter Schlager, Kirchberg/Piel, all of Austria

[73] Assignee: Siemens Aktiengesellschaft Österreich, Vienna, Austria

[21] Appl. No.: 244,410
[22] PCT Filed: Nov. 20, 1992
[86] PCT No.: PCT/EP92/02675
  § 371 Date: May 24, 1994
  § 102(e) Date: May 24, 1994
[87] PCT Pub. No.: WO93/11623
  PCT Pub. Date: Jun. 10, 1993

[30] Foreign Application Priority Data

Nov. 25, 1991 [AT] Austria ..................... 2348/91

[51] Int. Cl.⁶ .................................. H04L 27/14
[52] U.S. Cl. .................. 375/324; 375/334; 329/304
[58] Field of Search ................... 375/80, 94, 88, 375/75, 340, 316, 324, 334; 329/304, 307; 328/127; 455/324

[56] References Cited

U.S. PATENT DOCUMENTS

| | | | |
|---|---|---|---|
| 3,568,067 | 3/1971 | Williford | 375/80 |
| 4,507,617 | 3/1985 | Sasaki | 329/50 |
| 4,955,039 | 9/1990 | Rother et al. | 455/324 |
| 4,959,844 | 9/1990 | Walp | 329/307 |
| 5,052,050 | 9/1991 | Collier et al. | 455/324 |
| 5,197,085 | 3/1993 | Luff et al. | 375/88 |
| 5,230,011 | 7/1993 | Gielis et al. | 455/324 |

FOREIGN PATENT DOCUMENTS 0124133 5/1991 Japan ..................... 329/304

*Primary Examiner*—Stephen Chin
*Assistant Examiner*—T. Ghebretinsae
*Attorney, Agent, or Firm*—Hill, Steadman & Simpson

[57] ABSTRACT

A method for demodulating pulse messages, which have been converted into modulated signals, preferably for wireless digitized speech transmission, which is distinguished by minimal technical outlay and which can be carried out using circuits which can be designed in integrated circuit technology. The signal which is to be demodulated is subjected to quadrature modulation. Of the two quadrature components which have been thereby obtained one is subjected to a differentiation or an integration and the signal obtained in this manner and the signal of the other quadrature component are supplied, after analog-to-digital conversion, to in each case one comparator (9, 10). The digital output signals of the two comparators (9, 10) are assembled by means of a coincidence gate (11) to form the pulse message.

23 Claims, 1 Drawing Sheet

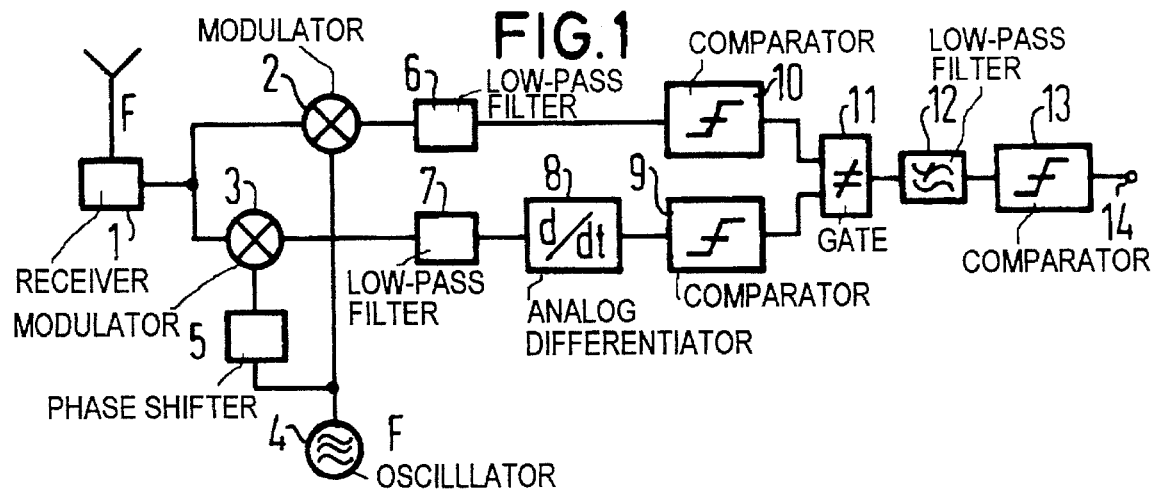
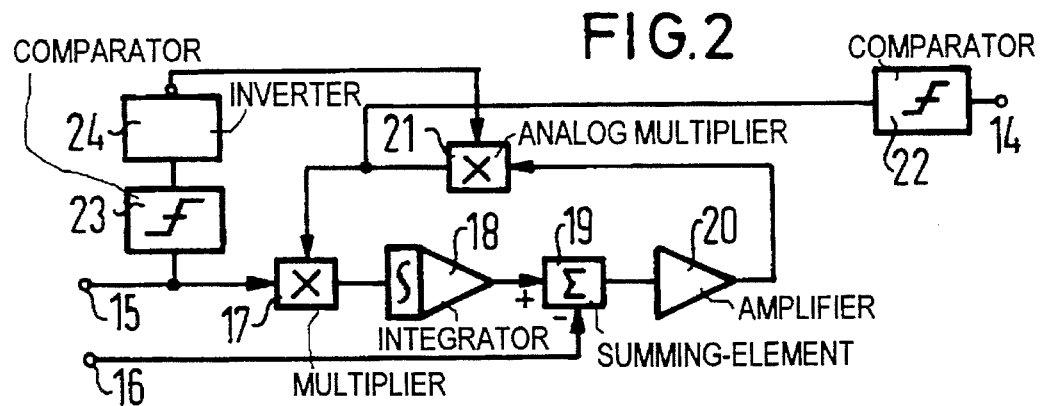
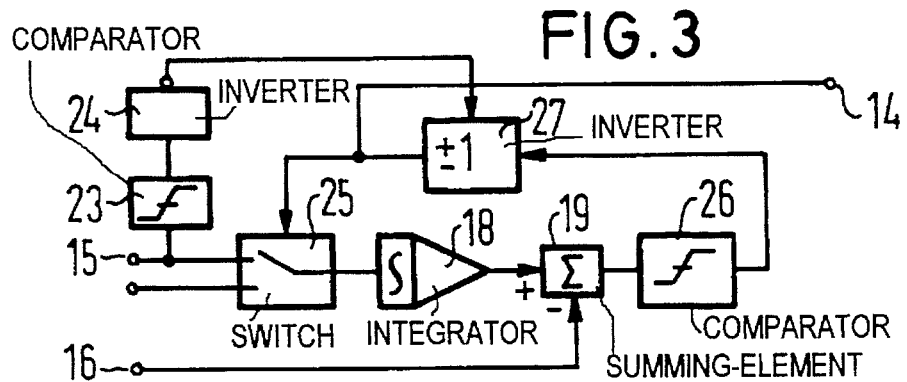

5,586,147

DEMODULATION METHOD USING QUADRATURE MODULATION

BACKGROUND OF THE INVENTION

The invention relates to a method for demodulating pulse messages, which have been converted into modulated signals, by using quadrature modulation.

When transmitting digitized signals in a wireless manner, as is normal for example in the case of cordless telephones, a miniaturization of the devices for reasons of ease of handling is aimed at, which at the present state of the art can be realized predominantly by an increased application of integrated circuits, that is to say by avoiding analog components.

A radio signal receiver has already been disclosed in GB-A-2 189 114 which, for demodulation of an FSK-signal, has a demodulation arrangement having quadrature modulation means, comparator/conversion means and a coincidence gate for digitally assembling the quadrature components.

SUMMARY OF THE INVENTION

The object on which the invention is based is to specify a demodulation method or a demodulation arrangement wherein a miniaturization of devices used for wireless signal transmission (for example cordless telephones) and integrability of the components used in this case can be achieved in particular by an appropriate embodiment of the demodulators.

In one embodiment of the present invention the method is for demodulating pulse messages, which have been converted into modulated signals, by using quadrature modulation, quadrature components of the modulated signals in the form of analog signals being converted from analog to digital with reference to a threshold value and subsequently assembled digitally by means of coincidence gate logic. The two quadrature components are obtained from the quadrature modulation in the form of analog signals. One quadrature component is differentiated prior to the analog to digital conversion, and the quadrature components, that have been converted from analog to digital, are digitally assembled by means of coincidence gate logic to form the pulse message.

In another embodiment of the present invention the method is for demodulating pulse messages, which have been converted into modulated signals, by using quadrature modulation, quadrature components of the modulated signals in the form of analog signals being converted from analog to digital with reference to a threshold value and subsequently assembled digitally by means of coincidence gate logic. The two quadrature components are obtained from the quadrature modulation in the form of analog signals. One quadrature component is integrated prior to the analog to digital conversion, and the quadrature components, that have been converted from analog to digital, are digitally assembled by means of coincidence gate logic to form the pulse message.

The demodulation method according to the invention is distinguished in that for its application only a single analog component is required, specifically one for carrying out the differentiation or the integration. All other components serve the digital signal processing and can accordingly be produced in integrated circuit technology and are easy to use in terms of circuitry. Therefore, the method according to the invention combines a digitally conditioned signal in the AF range with digital signal processing in the RF range by means of a single analog component.

Advantageous demodulation arrangements for carrying out the methods are as follows.

In one embodiment of the present invention the demodulation arrangement is for demodulating pulse messages, which have been converted into modulated signals, by using quadrature modulation, the quadrature components of the modulated signals in the form of analog signals being converted from analog to digital with reference to a threshold value and subsequently assembled digitally by means of an coincidence gate logic. Of the two quadrature components which have been obtained from the quadrature modulation in the form of analog signals, one quadrature component is differentiated prior to the analog to digital conversion, and the quadrature components that have been converted from analog to digital are assembled digitally by means the coincidence gate logic to form the pulse messages. Quadrature modulation means has first and second outputs for providing first and second quadrature components. Comparator/conversion means has first and second inputs and first and second outputs, the first input being connected to the first output of the quadrature means. A coincidence gate means is for digitally assembling the quadrature components. The coincidence gate means has first and second inputs connected to the first and second outputs, respectively, of the comparator/conversion means. A differentiation device is connected between the quadrature modulation means and the comparator/conversion means. The differentiation device has an input connected to the second output of the quadrature modulation means and has an output connected to the second input of the comparator/conversion means. The coincidence gate for digitally assembling the quadrature components can be a non-equivalence gate.

In a further embodiment of the present invention the demodulation arrangement is for demodulating pulse messages, which have been converted into modulated signals, by using quadrature modulation, quadrature components of the modulated signals in the form of analog signals being converted from analog to digital with reference to a threshold value and subsequently assembled digitally by means of coincidence gate logic. Of the two quadrature components which have been obtained from the quadrature modulation in the form of analog signals, one quadrature component is integrated prior to the analog-to-digital conversion, and the quadrature components, that have been converted from analog to digital, are digitally assembled by means of coincidence gate logic to form the pulse messages. Quadrature modulation means has first and second outputs for providing first and second quadrature components. Comparator/conversion means has first and second inputs and first and second outputs, the first and second inputs being operatively connected to the first and second outputs, respectively, of the quadrature modulation means. A coincidence gate means is for digitally assembling the quadrature components. The coincidence gate means has first and second inputs connected to the first and second outputs, respectively, of the comparator/conversion means. The coincidence gate means also has an output. An integration arrangement, together with the comparator/conversion means and the coincidence gate for digitally assembling the quadrature components, forms a digital control loop such that the quadrature components are compared with each other, such that stability of the control loop is maintained for loop gain being switched over, and such that the pulse message is formed with the generation of the control signal.

The integrator arrangement has an input connected to the second output of the quadrature modulation means and has an output connected to the second input of the comparator/conversion means, said integrator arrangement further having a feedback input connected to the output of the coincidence gate.

In another embodiment of the present invention the demodulation arrangement is for demodulating pulse messages, which have been converted into modulated signals, by using quadrature modulation, quadrature components of the modulated signals in the form of analog signals being converted from analog to digital with reference to a threshold value and subsequently assembled digitally by means of coincidence gate logic. Of the two quadrature components which have been obtained from the quadrature modulation in the form of analog signals, one quadrature component is integrated prior to the analog-to-digital conversion, and the quadrature components, that have been converted from analog to digital, are digitally converted by means of coincidence gate logic to form the pulse messages. Quadrature modulation means has first and second outputs for providing first and second quadrature components. Comparator/conversion means has first and second inputs and first and second outputs, the first and second inputs being operatively connected to the first and second outputs, respectively, of the quadrature modulation means. A coincidence gate is for digitally assembling the quadrature components. The coincidence gate means has first and second inputs connected tot he first and second outputs, respectively, of the comparator/conversion means. The coincidence gate means also has an output. An integrator arrangement which, together with the comparator/conversion means and the coincidence gate means for digitally assembling the quadrature components, forms an analog closed loop such that in the closed loop the quadrature components are compared with each other, such that the stability of the closed loop is maintained for loop gain being switched over, and such that the pulse message is generated from the analog control signal by means of an analog to digital converter. The integrator arrangement has an input connected to the second output of the quadrature modulation means and has an output connected to the second input of the comparator/conversion means, said integrator arrangement further having a feedback input connected to the output of the coincidence gate.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

A first exemplary embodiment of the invention is described with reference to FIG. 1.

In this arrangement FIG. 1 shows the design of a circuit for quadrature modulation in principle, wherein a demodulator having differentiation of a quadrature component is provided.

A second and third exemplary embodiment of the invention is illustrated in FIGS. 2 and 3.

FIGS. 2 and 3 show demodulators where integration of a quadrature component takes place.

DESCRIPTION OF THE PREFERRED EMBODIMENT

In the three exemplary embodiments named, the signal which is to be demodulated is a pulse message in which the pulses are represented by a center frequency F increased by a baseband frequency f, that is to say by a frequency (F+f), and the interpulse periods by the center frequency F reduced by this baseband frequency f, that is to say by a frequency (F−f). The center frequency F is at approximately 2 GHz, while the baseband frequency f is in a frequency position of approximately 0.5 MHz. These two frequencies (F+f) and (F−f) are received by a receiver 1, which is tuned to the center frequency F as carrier frequency, and supplied to two modulators 2 and 3. In the modulator 2, the signal received is mixed with a modulation frequency, which has been generated at the receiver location by an oscillator 4 and which is approximately equal to the center frequency F received. While the modulation oscillation of the oscillator 4 is directly supplied to the modulator 2, the modulator 3 receives a modulation oscillation which is phase-shifted with respect to the original modulation oscillation by a quarter period (90°) by means of a phase shifter 5. Two quadrature-modulated signals having the baseband frequency f are thus formed at the outputs of the modulators 2, 3. Possible RF-frequency interference originating from the demodulation, is filtered out by low-pass filters 6, 7.

The signal received during the duration of the pulses can be represented as a function of the time t in the following manner:

$$\cos 2\pi(F+f)t = \cos 2\pi Ft \cdot \cos 2\pi ft -$$

$$-\sin 2\pi Ft \cdot \cos 2\pi ft.$$

This signal is mixed in the modulator 2 with the oscillator oscillation $\cos 2\pi FT$ in a multiplicative way. Because of the orthogonality of cosine and sine functions, the first expression, which is on the right-hand side of the equation, provides, after the modulation, the quadrature component $\cos 2\pi ft$, while the second expression vanishes. In the modulator 3, on the other hand, through modulation with the oscillation $\sin \pi Ft$, the first expression is caused to vanish and the quadrature component $-\sin 2\pi ft$ is obtained from the second expression.

The signal received during the interpulse period can be represented by:

$$\cos 2\pi(F-f)t = \cos 2\pi Ft \cdot \cos 2\pi ft +$$

$$+\sin 2\pi Ft \cdot \sin 2\pi ft.$$

In this case also the quadrature component $\cos 2\pi ft$ is obtained in the modulator 2, while the modulator 3, however, provides the quadrature component $+\sin 2\pi ft$. Therefore, the output signals of the modulator 3 have opposite signs during, on the one hand, the duration of the pulses and, on the other hand, the duration of the interpulse periods. In the case of the method according to the invention, this difference is used as criterion for distinguishing between pulses and interpulse periods. The basis of this coincidence check is the fact, that —apart from sign and amplitude —the differential quotient and the integral of a sine function is a cosine function, and vice versa. The aim of the demodulation method according to the invention is to gain this distinction from the two respectively obtained quadrature components at minimum technical expense.

In the case of the embodiment according to FIG. 1, this is effected in detail by using an analog differentiation element 8 to form the differential quotient of the quadrature component obtained by the modulator 3, which quotient is converted by a downstream comparator 9 into a digital signal if a certain threshold value of the comparator input signal is exceeded. The mean of the range of the values for the differentiated quadrature component serves as threshold value. The quadrature component, which is provided by the modulator 2 and filtered by the low-pass filter 6, is supplied to a second comparator 10, which in turn establishes the existence of this signal on the basis of the threshold value being exceeded. Since the quadrature signals of the modulator 3 exhibit different signs in the case of pulses and interpulse periods, this difference in sign is also produced in the case of the differential quotients of these signals.

The outputs of the comparators 9 and 10 are connected to the inputs of a coincidence gate 11 (non-equivalence gate), which, in the case of the one quadrature signal and the differential quotient of the other quadrature signal having equal signs, signals the reception of a pulse, and, in the case of the signs not being equal, the reception of an interpulse period. The digital output signal of the coincidence gate 11 already corresponds essentially to the desired data signal; however, it still contains brief, faulty logic states due to switching operations in the comparators, and jitter. The faulty logic states, which occur briefly, can be eliminated in a low-pass filter 12, connected downstream from the non-equivalence gate 11, and in a further comparator 13. In this case, the cut-off frequency of the low-pass filter 12 has to be greater than the data rate. The mean of the voltages, which represent logic 0 and logic 1, is selected as operating point of the comparator 13. The demodulated raw data are sampled at output 14 of the circuit.

FIG. 2 shows a variant of a device for implementing the demodulation method according to the invention by using an analog integrator. The two quadrature components are present at the inputs 15, 16 of the circuit. The one quadrature signal is supplied to an integrator 18 via a multiplier 17. From the time integral of this quadrature component, supplied via the input 15, the value of the other quadrature component, supplied via the input 16, is subtracted in a summing element 19. The output signal of the summing element 19 is amplified by an amplifier 20, and, via a further analog multiplier 21, fed back to the second input of the multiplier 17 and provided to a comparator 22, which transmits the output signal. The drive of the analog multiplier 21 is performed by a comparator 23, which is connected to the input 15 and whose output signal is inverted by means of an inverter 24.

In the case of the demodulator circuit according to FIG. 2, the quadrature components are obtained from the reception signal in a manner identical to that in the circuit variant according to FIG. 1, with the aid of a circuit for quadrature modulation, comprising the components 1 to 5, having downstream low-pass filters 6 and 7. The output signals of the low-pass filters 6 and 7 are identical to the input signals 15 and 16 of the demodulator circuit according to FIG. 2.

The components 17 to 21 form a closed loop, in which the output signal of the amplifier 20 represents the control signal, which brings the amplitude of the quadrature signal 15 in line with the amplitude of the quadrature signal 16 with the aid of the multiplier 17. The phase shift by the angle $\pi/2$, existing between the quadrature signals, is compensated by the integrating element 18. The control signal is formed in the summing element 19 by subtracting the quadrature signal 16 from the quadrature signal 15, which is integrated and thereby phase-shifted by $\pi/2$, and amplified by the control signal amplifier 20.

In the case of positive loop gain, the control loop operates in a stable manner, only if the signal voltage of the quadrature signal 15 exhibits a negative sign. If the voltage of the quadrature signal 15 sweeps the range of positive signs, the sign of the loop gain is inverted by the multiplier 21.

If the voltage of the quadrature signal 15 has a positive sign, then the output voltage of the comparator 23 is likewise positive and the output voltage of the downstream inverter 24 negative, or else, for negative signs of the voltage of the quadrature signal 15, the output voltage of the comparator 23 is negative and the output voltage of the inverter 24 is correspondingly positive. Due to the limiting property of the comparator 23, the absolute value of the output voltage of the inverter 24 is a function only of the sign of the voltage of the quadrature signal 15 and not of its absolute value. By multiplying the output voltage of the inverter 24 and the control signal, which is present at the output of the control amplifier 20, in the multiplier 21, the control loop gain is switched over in such a manner, that a stable operational state of the control circuit 17 to 21 is ensured.

In stable operation of the control circuit 17 to 21, the control signal at the output of the control amplifier 20 is set such that the difference between the signals at the input 16 and at the output of the integrator 18 is as small as possible. In the case, when the voltage of the quadrature signal 16 is equal to the integrated voltage of the quadrature signal 15, the output voltage of the multiplier 21 must therefore exhibit a positive sign, otherwise a negative sign. The sign of the output voltage of the multiplier 21 corresponds to the data stream of the modulated received signal. In this way the demodulated pulse message can be obtained from the sign of the output voltage of the multiplier 21 with the aid of the comparator 22.

The circuit variant according to FIG. 3 differs from the one according to FIG. 2 in that no analog feedback path exists. The numberings are, to a large degree, taken from FIG. 2. The function of the multiplier 17, which is in the input loop of the circuit according to FIG. 2, is in this case taken over by an analog changeover switch 25, which in the case of a control signal of logic "1" switches through the quadrature signal of the input 15, and otherwise the inverted quadrature signal to the integrator 18. As in the case of the variant according to FIG. 2, the other quadrature signal, which is supplied by the input 16, is subtracted from the integrated quadrature signal. The output signal of the summing element 19 is converted into a digital signal by a comparator which is connected downstream. The output signal of the comparator 26 is used, via an inverter 27 which can be switched over, for switching over the changeover switch 25. The control signal for the changeover switch 25 is equal to the inverted data signal which is taken from the output 28. The triggering of the inverter 17 is effected by the comparator 23, the output signal of which is inverted by means of the inverter 24.

The demodulation circuit according to FIG. 3 is a simplified version of the demodulation circuit according to FIG. 2. Since only the sign of the control signal is required for the result of the demodulation method, the control loop can be closed by a digital feedback branch. The advantage of this embodiment, as compared to that according to FIG. 2, resides in the substantially reduced expense in terms of circuitry, since the complicated analog multipliers are replaced by digital components.

As in the demodulation circuit according to FIG. 2, here as well the output signals of the low-pass filters 6 and 7 according to FIG. 1 form the quadrature input signals 15 and 16. In contrast to the demodulation circuit according to FIG. 2, the quadrature signal 15 must in this case be available in a symmetrical form. The components 18, 19 and 25 to 27 form the control loop, in which the comparator 26 takes over the function of the control amplifier 20, and the coincidence gate 27 takes over the function of the multiplier 21 according to FIG. 2. The quadrature signal 15 and the control signal at the output of the coincidence gate 27 are multiplied in the selector switch 25, which in this way replaces the analog multiplier 17 according to FIG. 2. If the logic state of the control signal at the output of the coincidence gate 27 is equal to 1, which corresponds to a positive sign of the analog control voltage according to FIG. 2, then, in the selector switch 25, the positive element of the quadrature signal 15 is routed to the integrator 18, otherwise in the case of the logic state 0, which corresponds to a negative sign of the analog control voltage according to FIG. 2, the negative element of the quadrature signal 15 is passed on.

The control signal at the output of the coincidence gate 27 is already present in digital form and represents the pulse message, which has to be demodulated. An additional comparator, such as the comparator 22 in FIG. 2, is therefore not required.

The invention is not limited to the particular details of the method and apparatus depicated and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A method for demodulating pulse messages, which have been converted into modulated signals having first and second quadrature component pairs by using quadrature modulation, the first and second quadrature component pairs in the form of analog signals being converted from analog to digital with reference to a threshold value and subsequently assembled digitally by means of coincidence gate logic, comprising the steps of: of the first and second quadrature component pairs which have been obtained from the quadrature modulation in the form of analog signals, differentiating one quadrature component pair prior to the analog-to-digital conversion, and digitally assembling the first and second quadrature component pairs, that have been converted from analog to digital, by said means of coincidence gate logic to form the pulse message from operational signs of quadrature components of the first and second quadrature component pairs.

2. A method for demodulating pulse messages, which have been converted into modulated signals having first and second quadrature component pairs, by using quadrature modulation, the first and second quadrature component pairs in the form of analog signals being converted from analog-to-digital with reference to a threshold value and subsequently assembled digitally by means of coincidence gate logic, comprising the steps of: of the first and second quadrature component pairs which have been obtained from the quadrature modulation in the form of analog signals, integrating one quadrature component pair prior to the analog-to-digital conversion; and digitally assembling the first and second quadrature component pairs, that have been converted from analog-to-digital, by said means of coincidence gate logic to form the pulse message from operational signs of quadrature components of the first and second quadrature component pairs.

3. A demodulation arrangement for demodulating pulse messages, which have been converted into modulated signals having first and second quadrature component pairs by using quadrature modulation, the first and second quadrature component pairs in the form of analog signals being converted from analog to digital with reference to a threshold value and subsequently assembled digitally by means of coincidence gate logic, of the first and second quadrature component pairs which have been obtained from the quadrature modulation in the form of analog signals, one quadrature component pair being differentiated prior to the analog-to-digital conversion, and the first and second quadrature component pairs that have been converted from analog to digital being assembled digitally by said means of coincidence gate logic to form the pulse messages from operational signs of quadrature components of the first and second quadrature component pairs, comprising:

quadrature modulation means having first and second outputs for providing the first and second quadrature component pairs; comparator/conversion means having first and second inputs and first and second outputs, said first input being connected to said first output of said quadrature means; said coincidence means for digitally assembling the first and second quadrature component pairs, said coincidence gate means having first and second inputs connected to said first and second outputs, respectively, of said comparator/conversion means; a differentiation device connected between the quadrature modulation means and the comparator/conversion means, the differentiation device having an input connected to the second output of the quadrature modulation means and having an output connected to the second input of the comparator/conversion means.

4. The demodulation arrangement as claimed in claim 3, wherein the coincidence gate for digitally assembling the first and second quadrature component pairs is a non-equivalence gate.

5. A demodulation arrangement for demodulating pulse messages, which have been converted into modulated signals having first and second quadrature component pairs by using quadrature modulation, the first and second quadrature component pairs in the form of analog signals being converted from analog to digital with reference to a threshold value and subsequently assembled digitally by means of coincidence gate logic, of the first and second quadrature component pairs which have been obtained from the quadrature modulation in the form of analog signals, one quadrature component pair being integrated prior to the analog-to-digital conversion, and the first and second quadrature component pairs, that have been converted from analog to digital, being digitally converted by said means of coincidence gate logic to form the pulse messages, comprising:

quadrature modulation means having first and second outputs for providing the first and second quadrature component pairs; comparator/conversion means having first and second inputs and first and second outputs, said first and second inputs being operatively connected to the first and second outputs, respectively, of said quadrature modulation means; said coincidence gate means for digitally assembling the first and second quadrature component pairs, said coincidence gate means having first and second inputs connected to said first and second outputs, respectively, of said comparator/conversion means, said coincidence gate means also having an output; an integrator arrangement which, together with the comparator/conversion means and the coincidence gate means for digitally assembling the first and second quadrature component pairs, forms an analog closed loop such that in the closed loop the first and second quadrature component pairs are compared with each other, such that the stability of the closed loop is maintained for loop gain being switched over, and such that the pulse message is formed with the generation of an analog control signal that is provided in the analog closed loop by the comparator/conversion means, the integrator arrangement having an input connected to the second output of the quadrature modulation means and having an output connected to the second input of the comparator/conversion means, said integrator arrangement further having a feedback input connected to said output of said coincidence gate.

6. A demodulation arrangement for demodulating pulse messages, which have been converted into modulated signals having first and second quadrature component pairs by using quadrature modulation, the first and second quadrature component pairs in the form of analog signals being converted from analog to digital with reference to a threshold value and subsequently assembled digitally by means of coincidence gate logic, of the first and second quadrature component pairs which have been obtained from the quadrature modulation in the form of analog signals, one quadrature component pair being integrated prior to the analog-to-digital conversion, and the first and second quadrature component pairs, that have been converted from analog to digital, being digitally converted by said means of coincidence gate logic to form the pulse messages, comprising:

quadrature modulation means having first and second outputs for providing the first and second quadrature component pairs; comparator/conversion means having first and second inputs and first and second outputs, said first and second inputs being operatively connected to the first and second outputs, respectively, of said quadrature modulation means; said coincidence gate means for digitally assembling the first and second quadrature component pairs, said coincidence gate means having first and second inputs connected to said first and second outputs, respectively, of said comparator/conversion means, said coincidence gate means also having an output; an integration arrangement which, together with the comparator/conversion means and the coincidence gate for digitally assembling the first and second quadrature component pairs, forms a digital control loop such that the quadrature component pairs are compared with each other, such that stability of the control loop is maintained for loop gain being switched over, and such that the pulse message is formed with the generation of a control signal that is provided in the digital control loop by the comparator/conversion means, the integrator arrangement having an input connected to the second output of the quadrature modulation means and having an output connected to the second input of the comparator/conversion means, said integrator arrangement further having a feedback input connected to said output of said coincidence gate.

7. A method for demodulation of pulse messages, converted into modulated carrier signals and composed of pulses and pulse spaces, whereby (a) a pulse-width-related, first quadrature component pair and a pulse-space-related, second quadrature component pair are acquired from a modulated carrier signal within the framework of a quadrature modulation, (b) the first and second quadrature pairs are analog-to-digital converted threshold-related, and (c) the analog-to-digital converted, first and second quadrature component pairs are digitally combined to form a pulse message, comprising the steps of:

(d) differentiating one quadrature component pair of the first and second quadrature component pairs before the analog-to-digital conversion; and (e) digitally combining the analog-to-digital converted, first and second quadrature component pairs with an AND gate logic to form the pulse message such that, dependent on operational signs of quadrature components of the first and second quadrature component pairs, the arrangement of pulses and pulse spaces of the pulse message is defined.

8. The method according to claim 7, wherein the first quadrature component pair is defined as cos 2πft and −sin 2πft, respectively, and the second quadrature component pair is defined as cos 2πft and sin 2πft, respectively.

9. A method for demodulation of pulse messages, converted into modulated carrier signals and composed of pulses and pulse spaces, whereby (a) a pulse-width-related, first quadrature component pair and a pulse-space-related, second quadrature component pair are acquired from a modulated carrier signal within the framework of a quadrature modulation, (b) the first and second quadrature pairs are analog-to-digital converted threshold-related, and (c) the analog-to-digital converted, first and second quadrature component pairs are digitally combined to form a pulse message, comprising the steps of:

(d) integrating one quadrature component pair of the first and second quadrature component pairs before the analog- to-digital conversion; and (e) digitally combining the analog-to-digital converted, first and second quadrature component pairs with an AND gate logic to form the pulse message such that, dependent on operational signs of quadrature components of the first and second quadrature component pairs, the arrangement of pulses and pulse spaces of the pulse message is defined.

10. The method according to claim 9, wherein the first quadrature component pair is defined as cos 2πft and −sin 2πft, respectively, and the second quadrature component pair is defined as cos 2πft and sin 2πft, respectively.

11. An apparatus for the demodulation of pulse messages converted into modulated carrier signals and composed of pulses and pulse spaces, comprising:

(a) quadrature modulation means for generating a pulse-width-related, first quadrature component pair and a pulse-space-related, second quadrature component pair from the modulated carrier signal, (b) comparator/converter means for converting the first and second quadrature component pairs analog-to-digital threshold-related, (c) digital gate logic that digitally combines the analog-to-digital converted, first and second quadrature component pairs to form a pulse message, (d) means for differentiation of one quadrature component pair of the first and second quadrature component pairs, said means for differentiation being arranged between the quadrature modulation means and the comparator/converter means; and (e) the digital gate logic being an AND gate logic.

12. The apparatus according to claim 11, wherein the first quadrature component pair is defined as cos 2πft and −sin 2πft, respectively, and the second quadrature component pair is defined as cos 2πft and sin 2πft, respectively.

13. The apparatus according to claim 11, wherein the AND gate logic is an exclusive-OR gate.

14. An apparatus for The demodulation of pulse metsages converted into modulated carrier signals and composed of pulses and pulse spaces, comprising:

11

(a) quadrature modulation means for generating a pulse-width-related, first quadrature component pair and a pulse-space-related, second quadrature component pair from the modulated carrier signal, (b) comparator/converter means for converting the first and second quadrature component pairs analog-to-digital threshold-related, (c) digital gate logic that digitally combines the analog-to-digital converted, first and second quadrature component pairs to form a pulse message, (d) the digital gate logic being an AND gate logic; and (e) means for integration of one quadrature component pair of the first and second quadrature component pairs, said means for integration, together with the AND gate logic and the comparator/converter means, forming an analog control loop such that quadrature components of the first and second quadrature component pairs are compared to one another in the control loop, stability of the control loop being preserved when switching loop gain, and the pulse message being formed with an analog control signal derived from the AND gate logic.

15. The apparatus according to claim 14, wherein the first quadrature component pair is defined as cos 2πft and −sin 2πft, respectively, and the second quadrature component pair is defined as cos 2πft and sin 2πft, respectively.

16. An apparatus for the demodulation of pulse messages converted into modulated carrier signals and composed of pulses and pulse spaces, comprising:

(a) quadrature modulation means for generating a pulse-width-related, first quadrature component pair and a pulse-space-related, second quadrature component pair from the modulated carrier signal, (b) comparator/converter means for converting the first and second quadrature pairs analog-to-digital threshold-related, (c) digital gate logic that digitally combines the analog-to-digital converted, first and second quadrature component pairs to form a pulse message, (d) the digital gate logic being an AND gate logic; and (e) means for integration of one quadrature component pair of the first and second quadrature component pairs, said means for integration, together with the AND gate logic and the comparator/converter means, forming an analog control loop such that quadrature components of the first and second quadrature component pairs are compared to one another in the control loop, stability of the control loop being preserved when switching loop gain, and the pulse message being formed with generation of a control signal.

17. The apparatus according to claim 16, wherein the first quadrature component pair is defined as cos 2πft and −sin 2πft, respectively, and the second quadrature component pair is defined as cos 2πft and sin 2πft, respectively.

18. A method for demodulating pulse messages, which have been converted into modulated signals having quadrature components by using quadrature modulation, the quadrature components in the form of analog signals being converted from analog to digital with reference to a threshold value and subsequently assembled digitally by means of coincidence gate logic, comprising the steps of:

of the quadrature components which have been obtained from the quadrature modulation in the form of analog signals, differentiating one quadrature component prior to the analog-to-digital conversion, and digitally assembling the quadrature components, that have been

12 converted from analog to digital, by said means of coincidence gate logic to form the pulse message from operational signs of the quadrature components.

19. A method for demodulating pulse messages, which have been converted into modulated signals having quadrature components, by using quadrature modulation, the quadrature components in the form of analog signals being converted from analog-to-digital with reference to a threshold value and subsequently assembled digitally by means of coincidence gate logic, comprising the steps of:

of the quadrature components which have been obtained from the quadrature modulation in the form of analog signals, integrating one quadrature component prior to the analog-to-digital conversion; and digitally assembling the quadrature components, that have been converted from analog-to-digital, by said means of coincidence gate logic to form the pulse message from operational signs of the quadrature components.

20. A demodulation arrangement for demodulating pulse messages, comprising:

quadrature modulation means having first and second outputs for providing the quadrature components of pulse messages converted into modulated signals;

comparator/conversion means having first and second inputs and first and second outputs, said first and second inputs being operatively connected to the first and second outputs, respectively, of said quadrature modulation means for converting the quadrature components from analog to digital with reference to a threshold value and coincidence gate means for digitally assembling the quadrature components, said coincidence gate means having first and second inputs connected to said first and second outputs, respectively, of said comparator/conversion means, said coincidence gate means also having an output;

a differentiation device connected between the quadrature modulation means and the comparator/conversion means which integrates one quadrature component prior to the analog-to-digital conversion;

the differentiation device having an input connected to the second output of the quadrature modulation means and having an output connected to the second input of the comparator/conversion means.

21. The demodulation arrangement as claimed in claim 20, wherein the coincidence gate for digitally assembling the quadrature components is a non-equivalence gate.

22. A demodulation arrangement for demodulating pulse messages, with quadrature modulation means having first and second outputs for providing the quadrature components of pulse messages converted into modulated signals, comprising:

comparator/conversion means having first and second inputs and first and second outputs, said first and second inputs being operatively connected to the first and second outputs, respectively, of said quadrature modulation means for converting the quadrature components from analog to digital with reference to a threshold value and coincidence gate means for digitally assembling the quadrature components, said coincidence gate means having first and second inputs connected to said first and second outputs, respectively, of said comparator/conversion means, said coincidence gate means also having an output;

an integration arrangement which integrates one quadrature component prior to the analog-to-digital conversion and which, together with the comparator/conversion means and a multiplier connected to an analog to digital converter for digitally assembling the quadrature components shaped as said coincidence gate means forms an analog closed loop such that in the closed loop the quadrature components are compared with each other, such that the stability of the closed loop is maintained for loop gain being switched over, and such that the pulse message is formed with the generation of an analog control signal that is provided in the analog closed loop by the comparator/conversion means, the integration arrangement having an input connected to the second output of the quadrature modulation means and having an output connected to the second input of the comparator/conversion means, said integrator arrangement further having a feedback input connected to said output of said multiplier and to said input of said A/D converter.

23. A demodulation arrangement for demodulating pulse messages, with quadrature modulation means having first and second outputs for providing the quadrature components of pulse messages converted into modulated signals, comprising:

comparator/conversion means having first and second inputs and first and second outputs, said first and second inputs being operatively connected to the first and second outputs, respectively, of said quadrature modulation means for converting the quadrature components from analog to digital with reference to threshold value and coincidence gate means for digitally assembling the quadrature components, said coincidence gate means having first and second inputs connected to said first and second outputs, respectively, of said comparator/conversion means, said coincidence gate means also having an output;

an integration arrangement which integrates one quadrature component prior to the analog-to-digital conversion and which, together with the comparator/conversion means and the coincidence gate means, forms an analog closed loop such that in the closed loop the quadrature components are compared with each other, such that the stability of the closed loop is maintained for loop gain being switched over, and such that the pulse message is formed with the generation of an analog control signal that is provided in the analog closed loop by the comparator/conversion means, the integration arrangement having an input connected to the second output of the quadrature modulation means and having an output connected to the second input of the comparator/conversion means, said integrator arrangement further having a feedback input connected to said output of said coincidence gate means.

\* \* \* \* \*